United States Patent
Maney et al.

(10) Patent No.: US 11,765,995 B2
(45) Date of Patent: Sep. 26, 2023

(54) LOUVER POSITION SENSING SYSTEM FOR A SIEVE AND CHAFFER OF A COMBINE HARVESTER

(71) Applicant: HCC, Inc., Mendota, IL (US)

(72) Inventors: Jeffrey Harris Maney, Rockford, IL (US); John Gregorio, Chicago, IL (US)

(73) Assignee: HCC, INC., Mendota, IL (US)

( * ) Notice: Subject to any disclaimer, the term of this patent is extended or adjusted under 35 U.S.C. 154(b) by 0 days.

(21) Appl. No.: 16/848,404

(22) Filed: Apr. 14, 2020

(65) Prior Publication Data

US 2020/0236860 A1     Jul. 30, 2020

Related U.S. Application Data

(63) Continuation-in-part of application No. 16/102,358, filed on Aug. 13, 2018, now abandoned.

(Continued)

(51) Int. Cl.
*A01F 12/44*     (2006.01)
*A01D 41/127*     (2006.01)
(Continued)

(52) U.S. Cl.
CPC ........ *A01F 12/448* (2013.01); *A01D 41/1276* (2013.01); *A01D 75/282* (2013.01); *G01R 33/072* (2013.01); *G05D 1/0022* (2013.01); *G05D 2201/0201* (2013.01); *H04L 12/40* (2013.01); *H04L 2012/40215* (2013.01)

(58) Field of Classification Search
CPC . A01D 41/1276; A01D 41/1274; A01F 12/32; A01F 12/30–385; A01F 12/44–448; G01D 5/145
See application file for complete search history.

(56) References Cited

U.S. PATENT DOCUMENTS

4,259,829 A * 4/1981 Strubbe .............. A01D 41/1276
                                                                                    460/1
4,406,272 A * 9/1983 Kiess ........................ F02P 7/07
                                                                                  324/207.2

(Continued)

FOREIGN PATENT DOCUMENTS

CA          2382644       12/2002

*Primary Examiner* — Thomas B Will
*Assistant Examiner* — Joan D Misa
(74) *Attorney, Agent, or Firm* — Clark Hill PLC; James R. Foley

(57) ABSTRACT

A louver position sensing system for a sieve and chaffer of a combine harvester. One system provides that at least one sensor is in actual, physical contact with one or more louvers of the sieve and chaffer. Another system provides that a one or more magnet holders are mounted on louvers and, spaced away, sensors sense magnets in the magnet holders to determine the rotational position of the louvers. Either system allows for accurate, on-the-fly adjustment of the louvers in order to maximize the efficiency of operation of the sieve and chaffer. Preferably, the sensing systems are configured such that sensed position of the louvers is broadcast on the CAN bus of the combine harvester. As a result, the position information can be used to dynamically adjust the openings between the louvers of the sieve and chaffer to achieve more efficient grain cleaning as the machine and field variables change.

15 Claims, 12 Drawing Sheets

Related U.S. Application Data

(60) Provisional application No. 62/560,030, filed on Sep. 18, 2017.

(51) Int. Cl.
  *A01D 75/28* (2006.01)
  *G01R 33/07* (2006.01)
  *H04L 12/40* (2006.01)
  *G05D 1/00* (2006.01)

(56) References Cited

U.S. PATENT DOCUMENTS

| | | | | |
|---|---|---|---|---|
| 4,614,041 A * | 9/1986 | Darton | | G01C 9/00 |
| | | | | 33/327 |
| 5,170,849 A * | 12/1992 | Nikkei | | A01B 69/004 |
| | | | | 172/6 |
| 5,270,645 A * | 12/1993 | Wheeler | | G01D 5/145 |
| | | | | 123/376 |
| 5,444,369 A * | 8/1995 | Luetzow | | G01D 5/145 |
| | | | | 123/376 |
| 5,489,029 A * | 2/1996 | Jonckheere | | A01F 12/448 |
| | | | | 209/352 |
| 5,603,371 A * | 2/1997 | Gregg | | E06B 9/307 |
| | | | | 160/DIG. 17 |
| 5,861,745 A * | 1/1999 | Herden | | G01B 7/30 |
| | | | | 324/207.2 |
| 5,932,942 A * | 8/1999 | Patyk | | H02K 11/33 |
| | | | | 310/58 |
| 6,137,288 A * | 10/2000 | Luetzow | | G01D 5/145 |
| | | | | 324/207.2 |
| 6,300,739 B1 * | 10/2001 | Ratliff | | H02K 11/33 |
| | | | | 318/689 |
| 6,323,643 B1 * | 11/2001 | Kordecki | | G01D 5/145 |
| | | | | 324/207.2 |
| 6,396,260 B1 * | 5/2002 | Reichl | | G01D 5/145 |
| | | | | 324/207.2 |
| 6,468,154 B1 * | 10/2002 | Eggenhaus | | A01F 12/448 |
| | | | | 460/101 |
| 6,497,035 B1 * | 12/2002 | Ratliff | | G01B 7/003 |
| | | | | 174/117 F |
| 6,579,172 B2 * | 6/2003 | Lauer | | A01D 41/1276 |
| | | | | 460/1 |
| 6,632,136 B2 * | 10/2003 | Anderson | | A01F 12/448 |
| | | | | 460/101 |
| 6,761,630 B1 * | 7/2004 | Schwinn | | A01F 12/448 |
| | | | | 460/101 |
| 7,371,162 B2 * | 5/2008 | Matousek | | A01F 12/448 |
| | | | | 460/101 |
| 9,067,091 B2 * | 6/2015 | Caliendo | | A62C 2/14 |
| 9,526,211 B2 * | 12/2016 | Murray | | A01D 41/1276 |
| 10,238,040 B2 * | 3/2019 | Meschke | | A01F 12/448 |
| 10,314,237 B2 * | 6/2019 | Missotten | | A01D 41/1276 |
| 10,502,591 B2 * | 12/2019 | Mednikov | | G01D 5/2013 |
| 2007/0229058 A1 * | 10/2007 | Wolf | | G01D 5/145 |
| | | | | 324/207.24 |
| 2008/0051024 A1 * | 2/2008 | Caliendo | | A62C 2/247 |
| | | | | 454/369 |
| 2012/0215395 A1 * | 8/2012 | Aznavorian | | A01B 69/008 |
| | | | | 701/25 |

* cited by examiner

LOUVER POSITION SENSING SYSTEM FOR A SIEVE AND CHAFFER OF A COMBINE HARVESTER

RELATED APPLICATION (PRIORITY CLAIM)

This application is a continuation-in-part of U.S. patent application Ser. No. 16/102,358, filed Aug. 13, 2018, which claims the benefit of U.S. Provisional Application Ser. No. 62/560,030, filed Sep. 18, 2017. application Ser. No. 16/102,358 and 62/560,030 are hereby incorporated by reference in their entirety.

BACKGROUND

The present invention generally relates to systems for sensing the rotational position of the louvers of a sieve and chaffer of a combine harvester, and more specifically relates to an improved louver sensing system.

Typically, grain and seed crops are harvested by having a combine harvester detach the grain from unwanted portions of the source plants and other matter, such as rocks and weeds. Specifically, a mixture of detached grain and other vegetation parts (i.e., material other than grain ("MOG")) is carried by a conveyer into the interior of the housing of the combine harvester for processing, to further separate the grain from the MOG. In the course of processing within the combine, the mixed grain and MOG are passed over sieves and chaffers which are agitated (i.e., shaken) and configured to permit the grain to fall, via gravity, through the sieve and chaffer for separation from the MOG.

FIGS. 1 and 2 illustrate portions of a typical sieve and chaffer (i.e., "sieve") 10. As shown, the sieve 10 comprises a generally rectangular frame 12 and a plurality of overlapping banks of slats or louvers 14. The slats 14 define openings through which the grain falls (i.e., by gravity). Typically, each bank of slats 14 includes two or more slats separated by one or more dividers 16 which are connected to the frame 12. Each bank of slats is mounted end-to-end on a wire 18 which is rotatably mounted to the frame 12. A typical sieve is provided as being a single rectangular frame having one or more overlapping banks of slats.

As shown in FIGS. 1 and 2, a sieve can also include a handle 20 which is connected to an elongated adjustment bar 22 which extends perpendicularly to the louver wires 18 and includes a plurality of longitudinally spaced recesses or apertures for engaging a crank on each wire 18, thereby controlling the angular disposition of the slats 14 and the size of the openings between the banks of slats. By this arrangement, the slats 14 effectively become louvers and can be adjusted, using the handle 20, to any position between fully open and fully closed. The sieve 10 is mechanically supported for reciprocal shifting movement or agitation (i.e., shaking) to cause the grain to separate from the MOG and fall downwardly through the openings between the banks of slats.

By providing that the rotational position of the louvers 14 can be adjusted, it is possible to allow for various crop processing, crop condition variation, and feed rate variation. Because the openings between the louvers 14 can be varied, different size grain can be processed without changing out the sieve and/or chaffer unit itself (i.e., for a similar sieve and chaffer unit having different sized openings between the slats 14).

As shown in FIG. 3, some conventional systems provide a visual louver position indicator 26, which an operator has to view in order to determine the extent to which the louvers 14 are open. As shown, such systems provide indicia 28 on the sieve divider 16 and an associated indicating arm 30. As the handle 20 (see FIGS. 1 and 2) is adjusted, the arm 30 changes its position (i.e., moves) relative to the indicia 28. The position of the arm 30 relative to the indicia 28 provides the operator with a visual indication of the extent to which the louvers 14 are open.

Other systems provide that the rotational position of the louvers is determined via an electromechanical actuator position system. Conventional louver position sensing relies on the translation of a linear ball-screw actuator equipped with a sensing means (i.e., potentiometer, encoder, etc.) to report the linear position of the actuator. This system is inaccurate for a plurality of reasons, such as: backlash associated with the actuator, resolution of the sensing means, translation of the position of the ball screw through multiple linkages, distortion of the louver in its position due to loading, etc. These system inaccuracies do not allow for accurate feedback, and thus cause inaccurate position settings resulting in poor dynamic grain cleaning efficiency.

In general, combine harvesters are progressing more and more toward autonomous operation and will require more accurate feedback systems than is currently available in order to enable on-the-fly sieve/chaffer adjustments.

SUMMARY

An object of an embodiment of the present invention is to provide an improved louver position sensing system for a sieve and chaffer used in a combine harvester.

Briefly, an embodiment of the present invention provides a louver position sensing system for a sieve and chaffer of a combine harvester. The system provides that at least one sensor is in actual, physical contact with one or more louvers of the sieve and chaffer. Preferably, the sensor comprises a hall-effect sensor which provides that a sensor probe extends from a housing and is physically connected to one of the louvers. More than one sensor can be utilized where multiple sensors are connected to multiple louvers of the sieve. Regardless, preferably the accuracy of the sensing of the rotational position of the louver(s) allows for accurate, on-the-fly adjustment of the rotational position of the louvers in order to maximize the efficiency of operation of the sieve and/or chaffer.

Another embodiment of the present invention provides that a magnet holder (which preferably houses at least one magnet) is mounted directly on one of the louvers of the sieve and chaffer. A sensor, such as a hall effect sensor in a housing, senses the location of the at least one magnet, thereby effectively sensing the rotational position of the louver. A second magnet holder may be mounted directly on a different louver of the sieve and chaffer, and a second sensor, such as another hall effect sensor, may sense the location of at least one magnet in the second magnet holder. Preferably, the second sensor is connected to the first sensor and electronics in the housing which contains the first sensor is configured to calculate the rotational positions of both louvers to which the magnet holders are mounted.

Preferably, the sensing system is configured such that the sensed position of the louvers is broadcast on the Controller Area Network (CAN) bus of the combine harvester. As a result, the position information can be used to dynamically adjust the openings between the louvers of the sieve and chaffer to achieve more efficient grain cleaning as the machine and field variables change. Alternatively, the system can be configured such that the operator can perform the adjustment, either electronically or manually, after being informed of the rotational position of the louvers by the system. Regardless, incorporating a directly coupled sensor at the louver and utilizing the actuator feedback system, a closed loop control system can be created to autonomously adjust the openings of the louvers of the sieve and chaffer on-the-fly based on specific control parameters within the host control of the combine harvester.

BRIEF DESCRIPTION OF THE DRAWINGS

The organization and manner of the structure and operation of the invention, together with further objects and advantages thereof, may best be understood by reference to the following description taken in connection with the accompanying drawings wherein like reference numerals identify like elements in which.

DESCRIPTION OF THE ILLUSTRATED EMBODIMENTS

Figure 1:
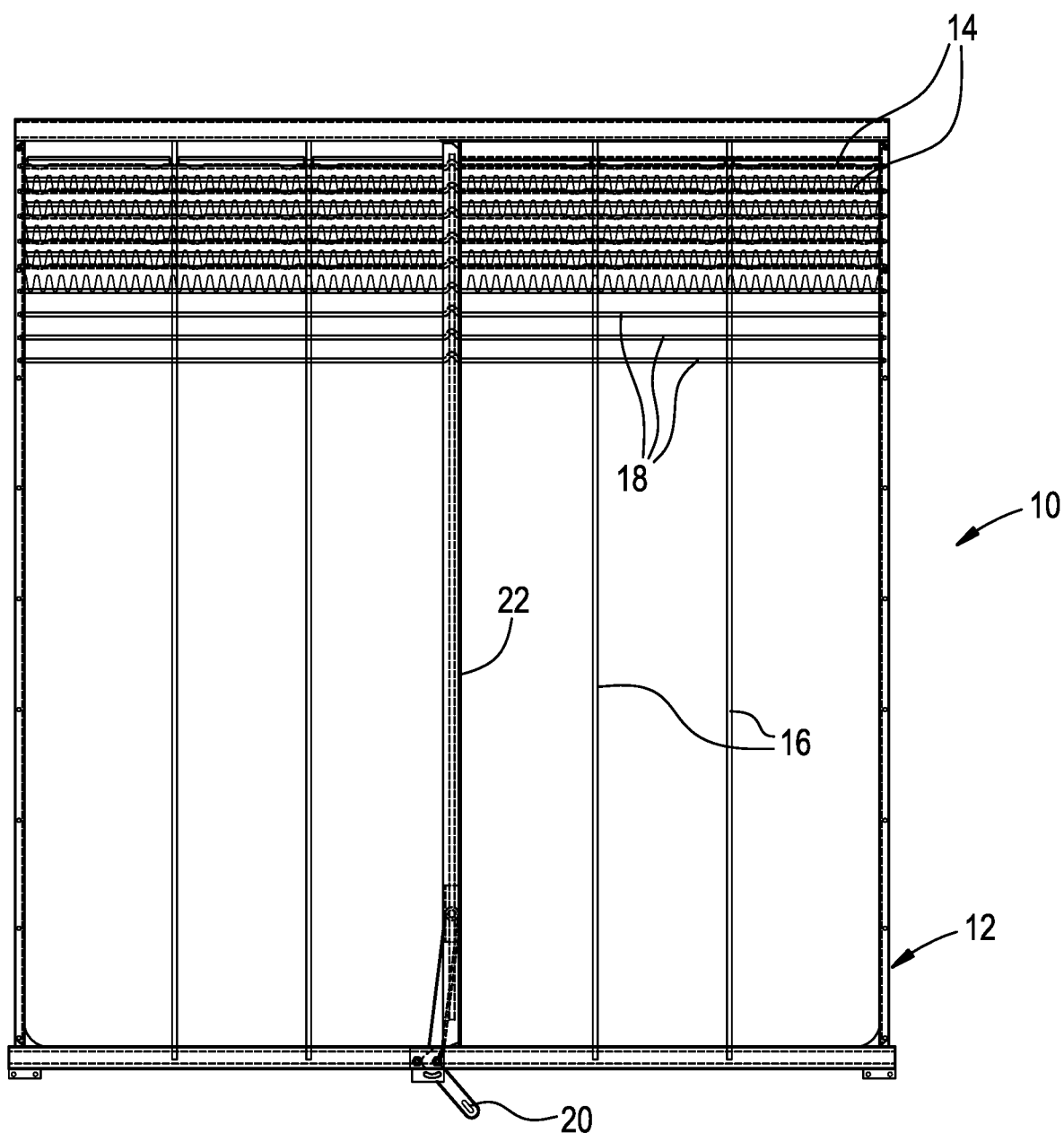
FIG. 1 is a top view of a standard sieve and/or chaffer construction.

While this invention may be susceptible to embodiment in different forms, there are shown in the drawings and will be described herein in detail, specific embodiments with the understanding that the present disclosure is to be considered an exemplification of the principles of the invention, and is not intended to limit the invention to that as illustrated.

Figure 2:
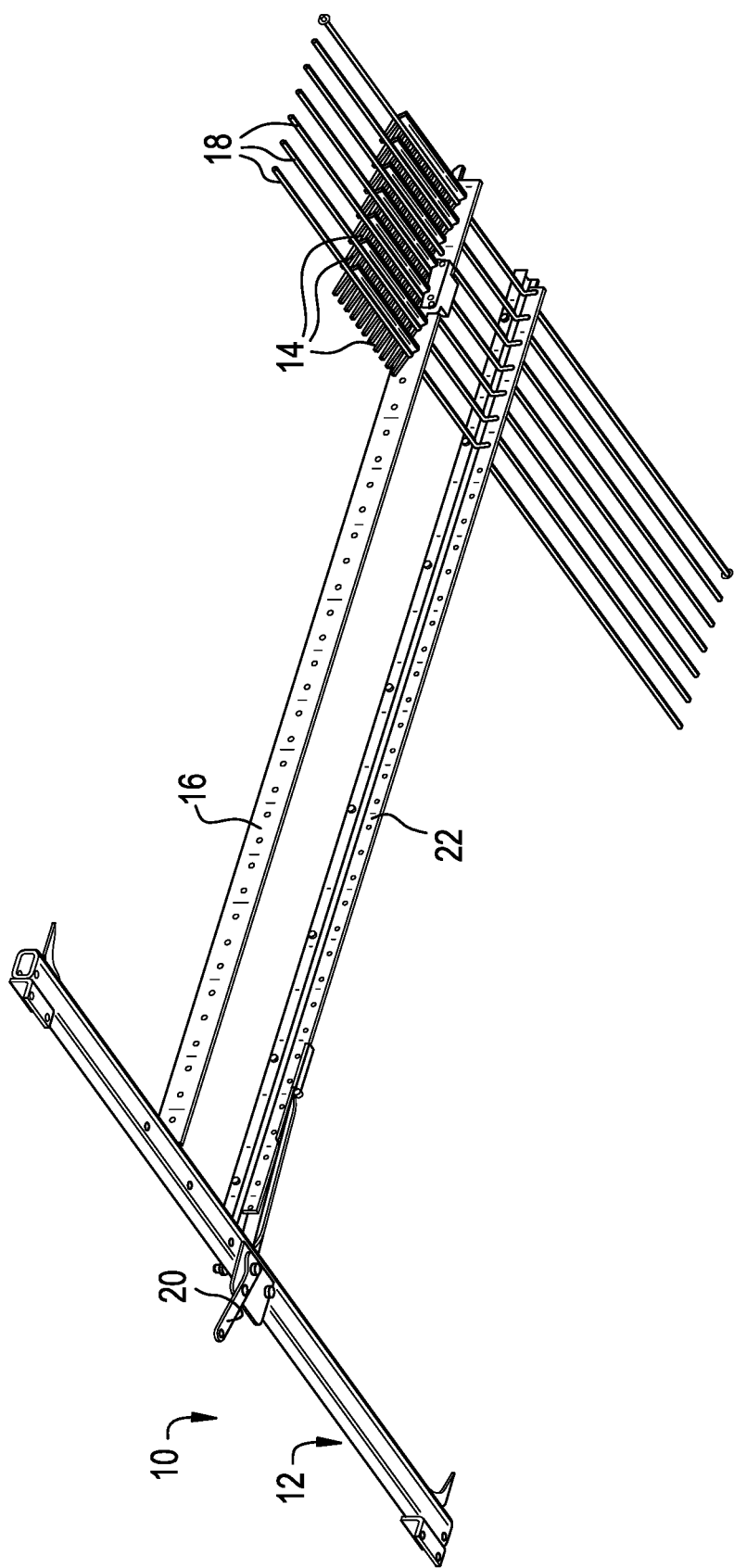
FIG. 2 provides a perspective view of the sieve/chaffer shown in FIG. 1, omitting parts of the frame so other components can be more easily seen.
Figure 3:
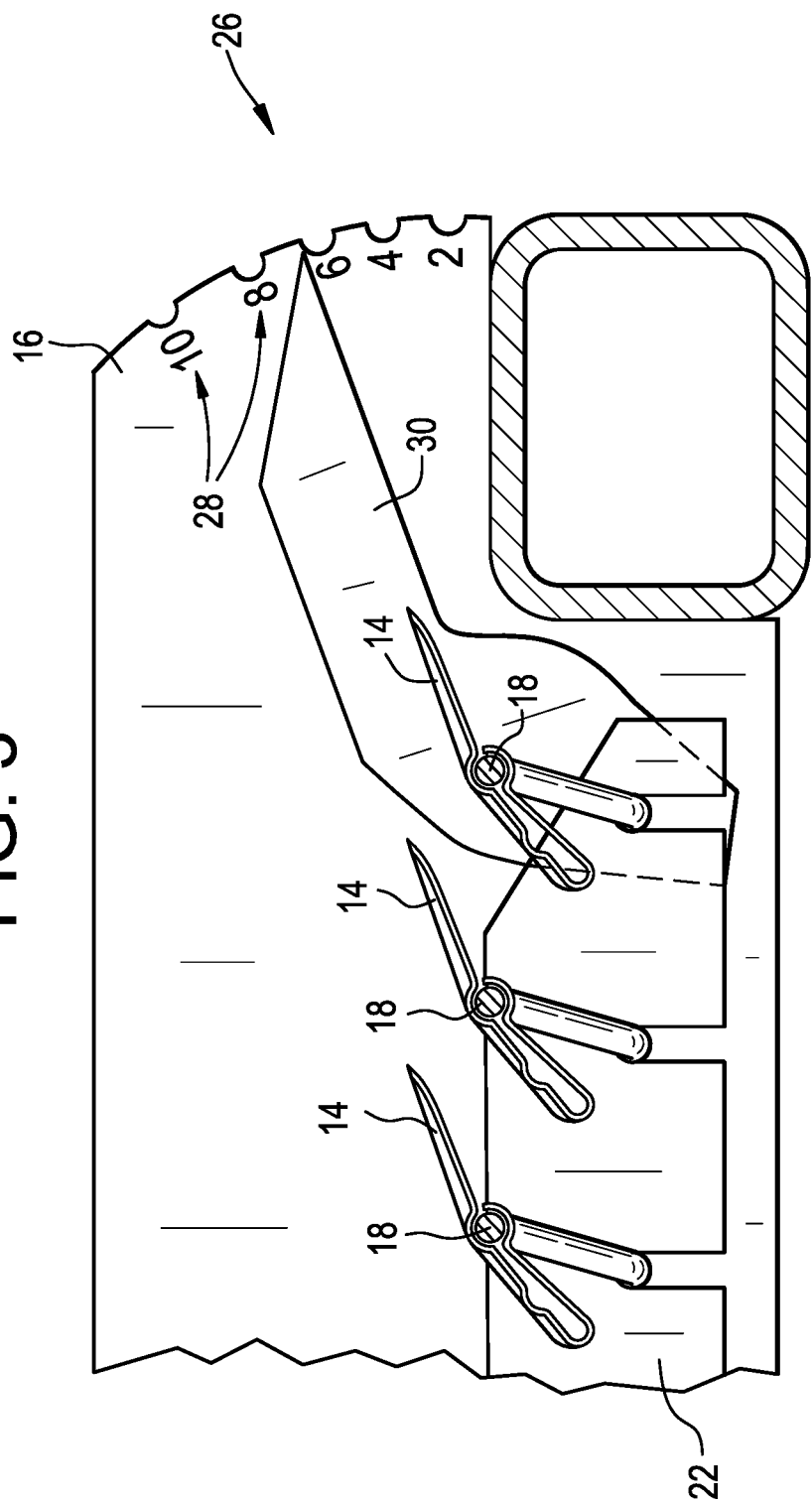
FIG. 3 illustrates a conventional visual louver position indicator.
Figure 4:
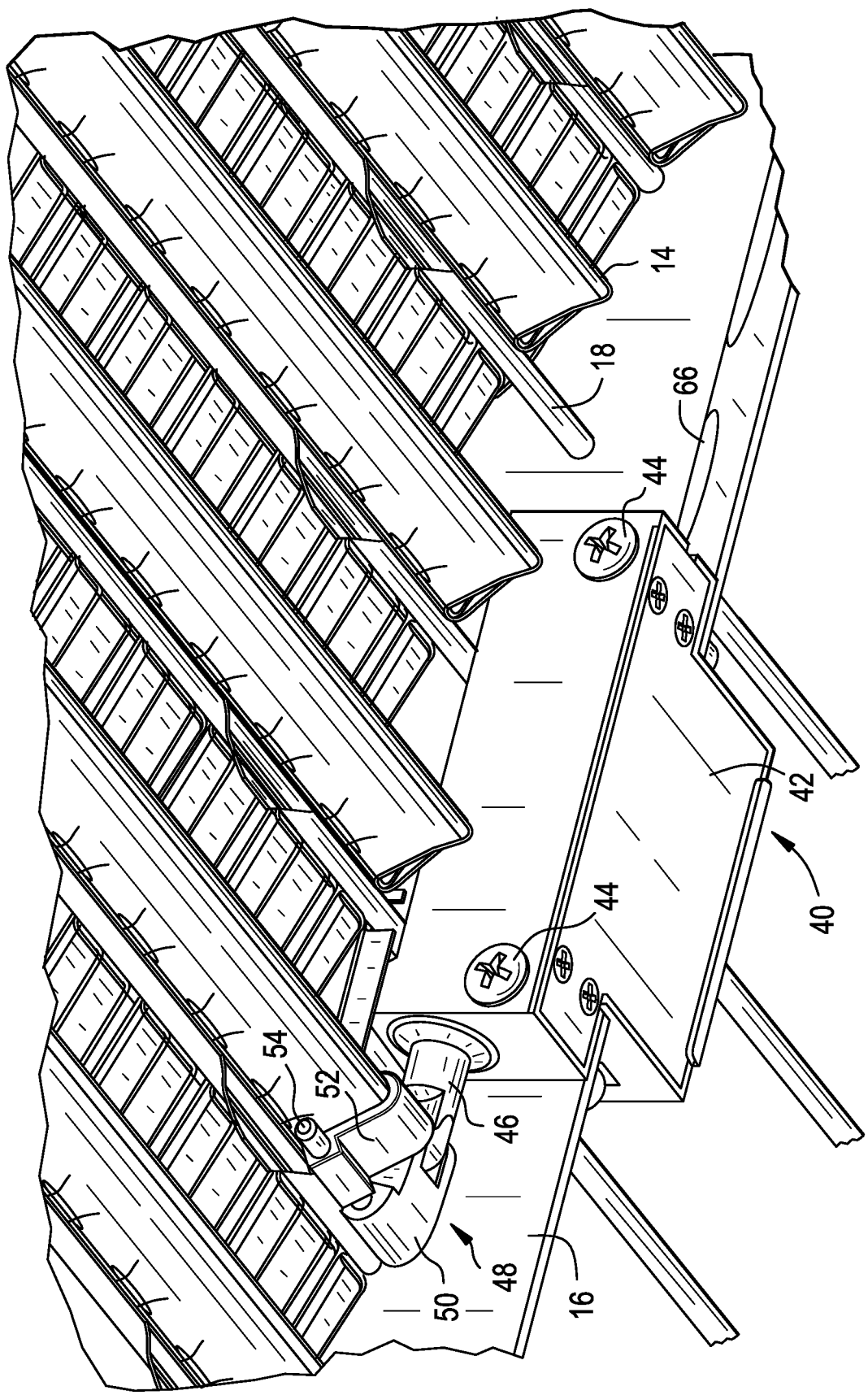
FIG. 4 shows a sensor mounted to a divider of a sieve and chaffer, in accordance with one embodiment of the present invention.
Figure 5:
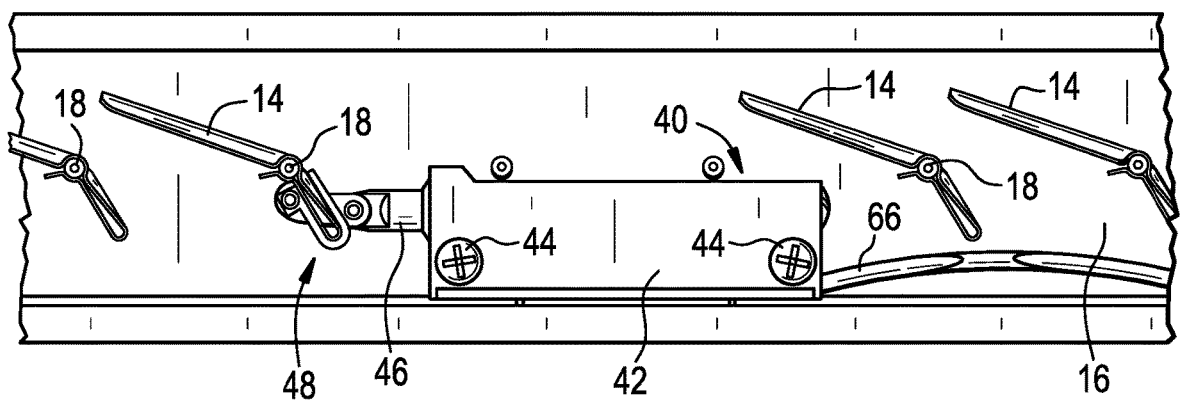
FIG. 5 is a side view of the sensor mounting arrangement shown in FIG. 4 (omitting two sieve louvers for clarity)
Figure 6:
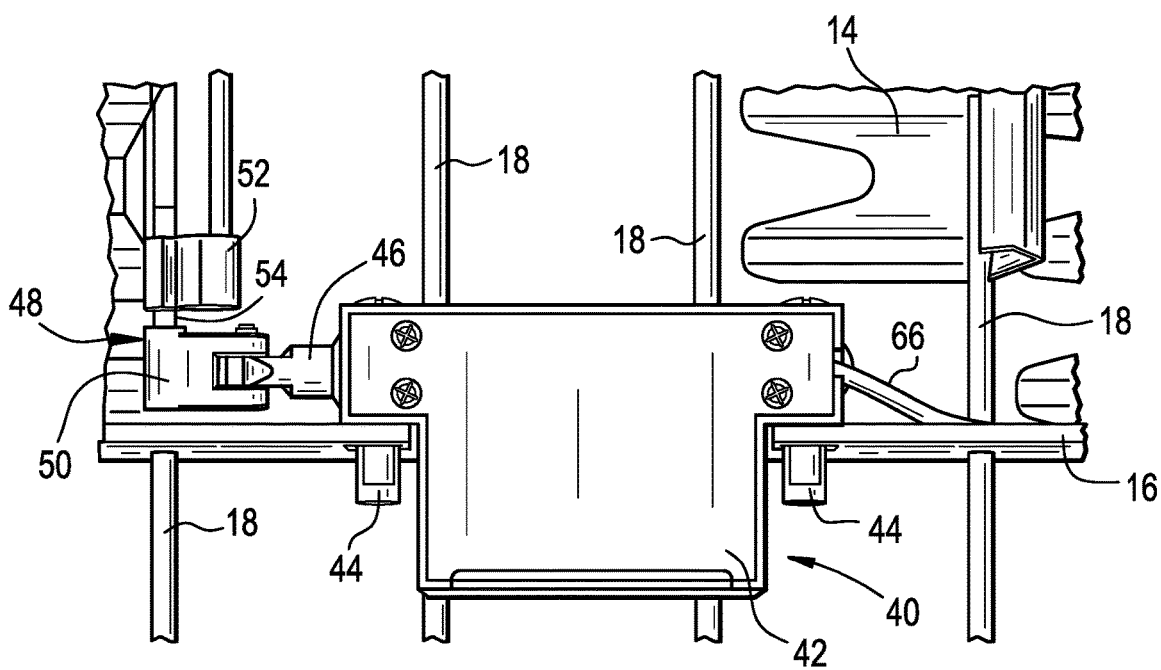
FIG. 6 is a bottom view of the sensor mounting arrangement shown in FIGS. 4 and 5.

An embodiment of the present invention provides a louver position sensing system for a sieve and chaffer of a combine harvester. The system provides that at least one sensor is in actual, physical contact with one or more louvers of the sieve and/or chaffer. As shown in FIGS. 4-6, the sensor 40 is preferably mounted to one of the dividers 16 of the sieve and chaffer 10 (see FIGS. 1 and 2). Preferably, the sensor 40 comprises a housing 42 which is mounted to the divider 16 via one or more fasteners 44 (or via other means), and a sensor probe 46 extends from the housing 42 and is actually, physically connected to one of the louvers 14 via a sensor coupling 48. As shown in FIGS. 4 and 6, the sensor coupling 48 may comprise a first component 50 connected to the end of the sensor probe 46, a second component 52 connected to a windvane of one of the sieve louvers 14, and a connecting member 54 (such as a pin) which links the first component 50 to the second component 52. Of course, other sensor coupling configurations can be used to connect the sensor probe 46 to the louver 14.

Figure 7:
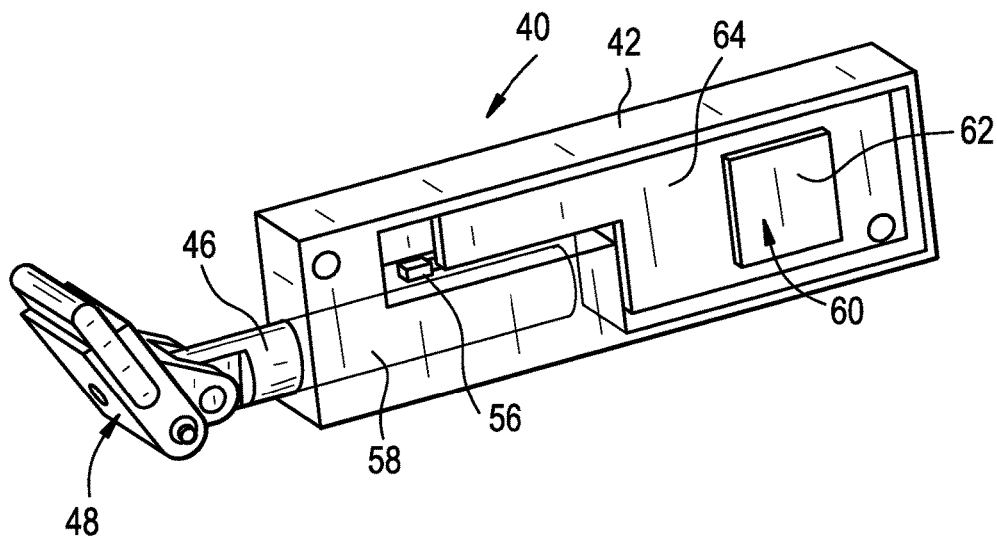
FIG. 7 provides a simplified view of the inside of the sensor shown in FIGS. 4-6.
Figure 8:
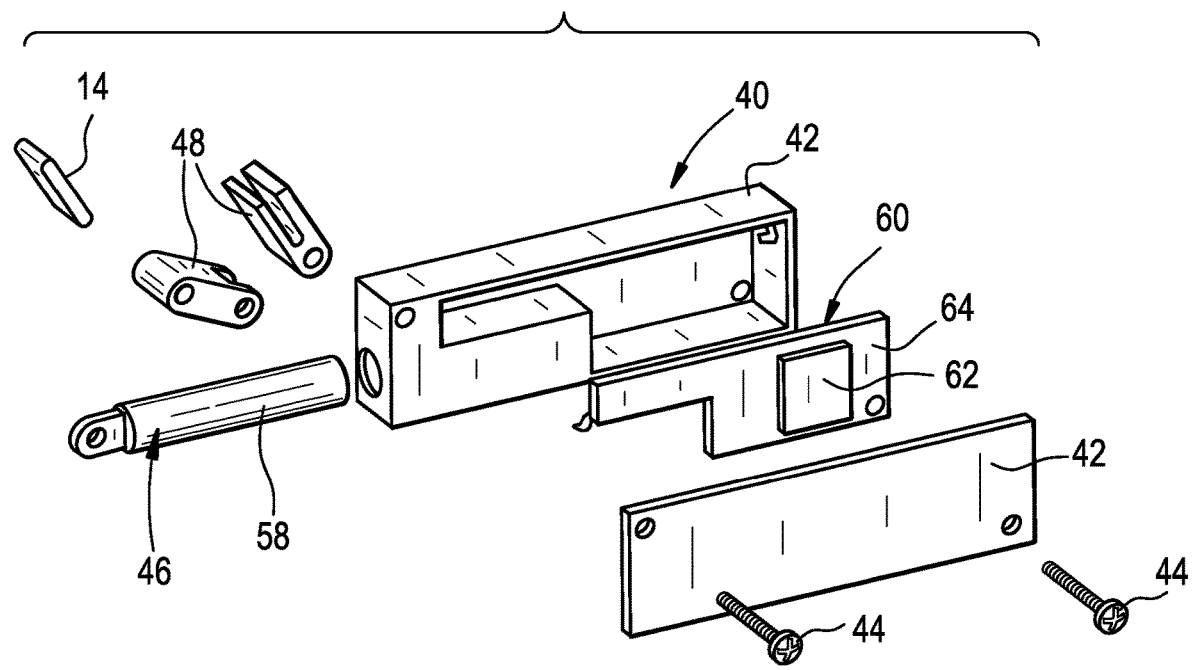
FIG. 8 is similar to FIG. 7, but provides an exploded view.

FIGS. 7 and 8 show inside the sensor housing 42. As shown, a hall effect sensor 56 is preferably inside the housing 42 for effectively sensing a cylindrical magnet 58 secured within the sensor probe 46. Preferably, the probe 46 is manufactured from a non-magnetic material and is free to travel linearly within the sensor housing 42. The hall effect sensor 56, via the magnet 58, senses the linear position of the sensor probe 46 and, as a result, the rotational position of the louver 14 to which the sensor probe 46 is connected via the sensor coupling 48. As the louver 14 is opened and closed via an adjustment system, such as an electromechanical motor or some other means, the coupling system translates the louver rotation to linear motion. This linear motion displaces the probe 46 within the sensor housing 42. The hall effect sensor 56 senses the position of the magnet 58 housed within the probe 46.

Figure 9:
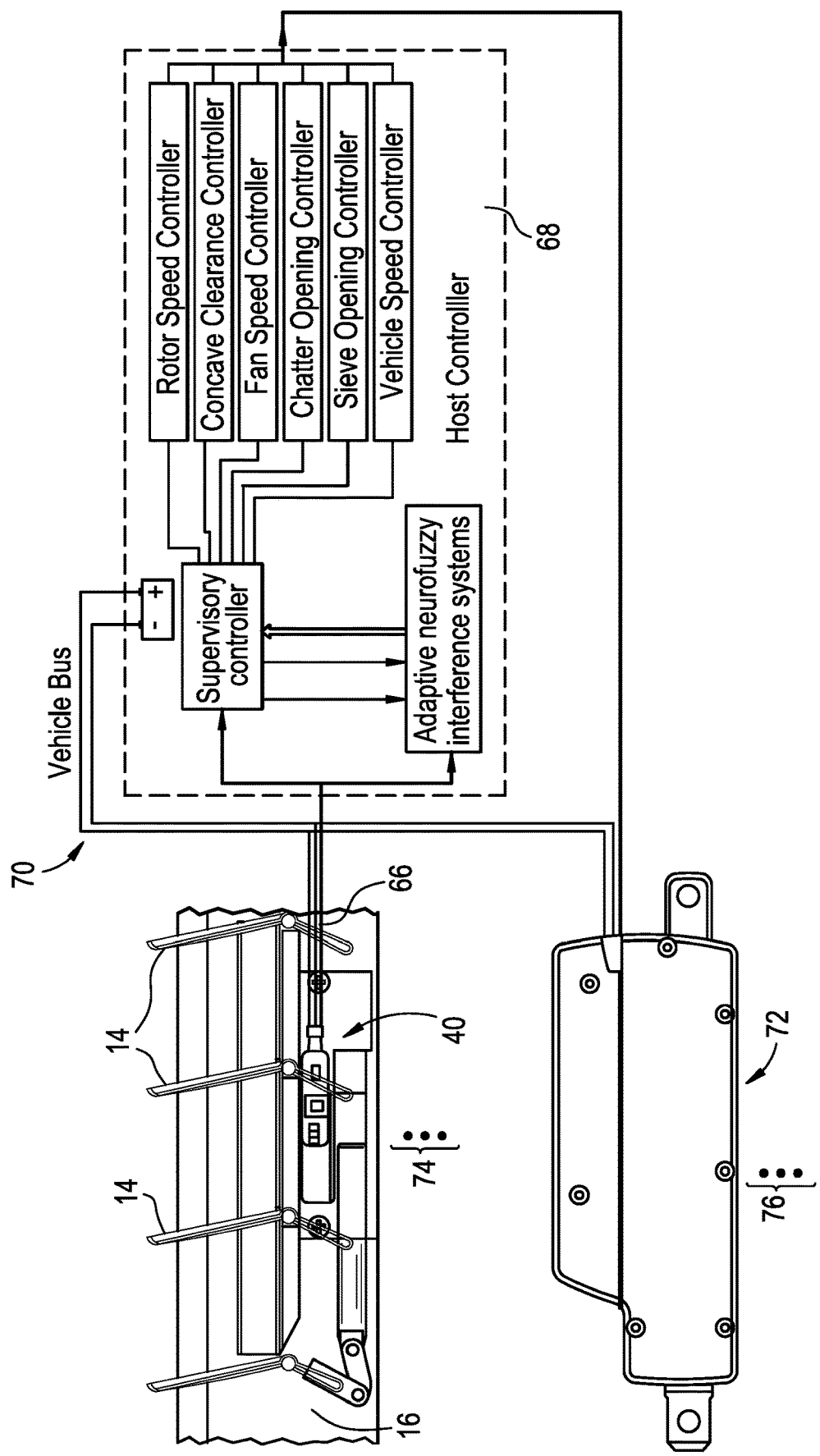
FIG. 9 illustrates one possibility of a system architecture with which the sensor shown in FIGS. 4-8 can be employed.

Electronics 60 are also provided inside the housing 42, such as one or more integrated circuits 62 on a printed circuit board 64, which are connected to the hall effect sensor 56, for determining the rotational position of the louver 14, via the hall effect sensor 56. A cable 66 extends from the housing 42 and, as shown in FIG. 9, effectively communicates the position of the louver 14 (e.g., the linear position of the sensor probe 46) back to a host controller 68 of the combine harvester via the vehicle CAN bus 70. The electronics 60 within the sensor housing 42 is configured to translate the probe's linear motion into an output suitable to be interpreted by the host controller 68. This output can be expressed in a number of ways (i.e., change in distance between louver "teeth", angle, mVdv, etc.) and can be broadcast to the CAN bus 70 of the combine harvester or transmitted directly to a controller of the combine harvester. The electronics 60 provided inside the sensor housing 42 may include additional sensors integrated onto the printed circuit board 64, such as one or more accelerometers, temperature sensors, moisture sensors, wireless transmitters, etc., thereby allowing additional functionality of the overall sensor output to the host controller 68 of the combine harvester.

As shown in FIG. 9, a sieve linear actuator 72 can also be connected to the bus 70 (as well as to an adjustment bar 22 (see FIGS. 1 and 2) of the sieve and chaffer 10). In fact, more than one sensor 40 can be connected to the bus (as represented by dots 74) and more than one sieve linear actuator 72 can be connected to the bus (as represented by dots 76). Because sieves and chaffers are loaded differently depending on their position within the cleaning shoe of the combine harvester, an embodiment of the present invention provides that multiple sensors are connected to each sieve and chaffer to allow for accurate sieve and chaffer opening measurements while crop loading differs across the sieve and chaffer. Additionally, because some sieves and chaffers have multiple adjustments means (i.e., multiple adjustment bars), preferably each adjustable area of the sieve and chaffer utilizes an independent sensor, thereby allowing for more precise differential opening opportunities. In other words, the different sections of a single sieve and chaffer can have different sized louver openings, detected by different sensors and changed using different linear actuators, all part of the same system.

Figure 10:
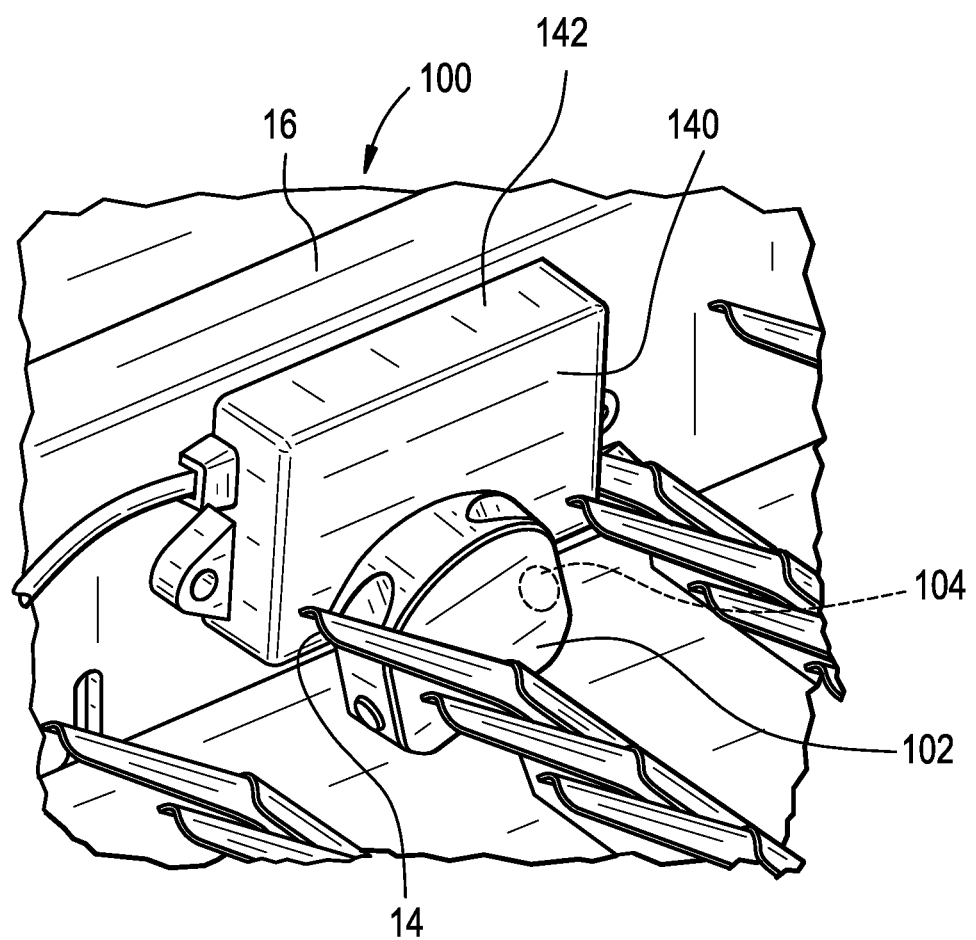
FIG. 10 illustrates an alternative embodiment of the present invention, specifically a perspective view showing a magnet holder mounted directly to a louver and a sensor mounted on a divider of a sieve and chaffer.
Figure 11:
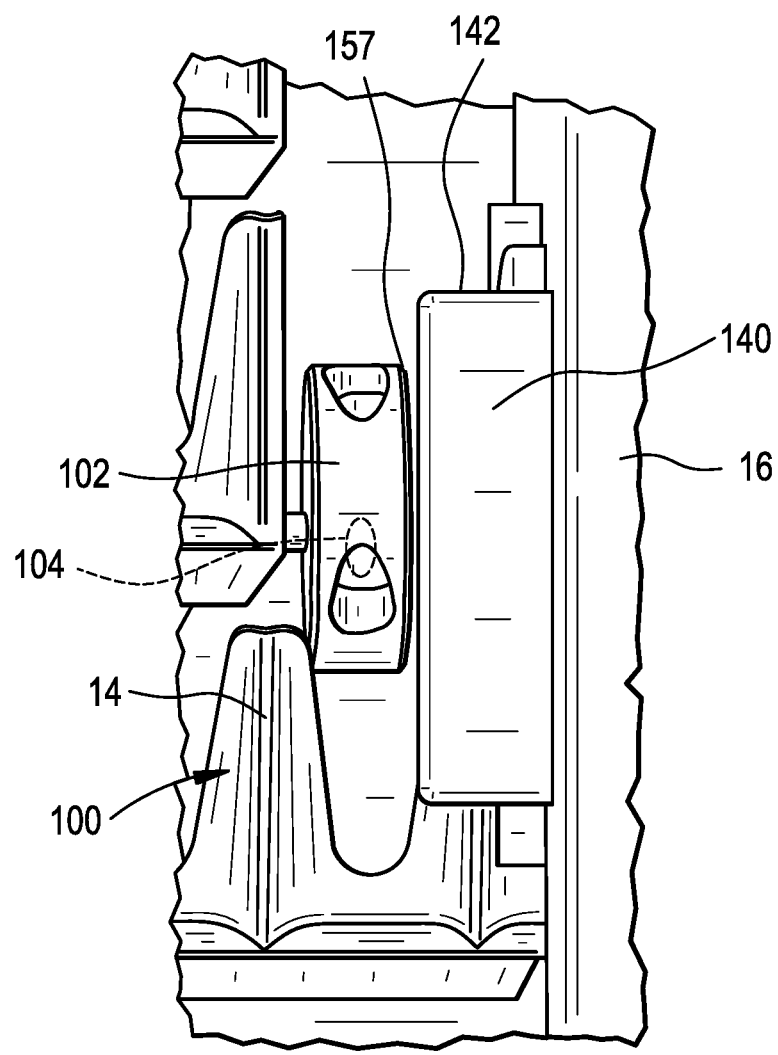
FIG. 11 is similar to FIG. 10, but provides a side view showing a gap between the magnet holder and the sensor.

FIGS. 10 and 11 illustrate an alternative embodiment of the present invention. As shown, instead of providing a sensor probe 46 (see FIGS. 7 and 8, for example), which extends out of a housing 42 of a sensor 40, the system 100 shown in FIGS. 10 and 11 provides that a magnet holder 102 houses at least one magnet 104 and is mounted directly to a louver 14. A sensor 140 is spaced away from the magnet holder 102 (see the gap 157 shown in FIG. 11), preferably mounted on one of the dividers 16 (see FIGS. 10 and 11). The sensor 140 provides a housing 142 in which is disposed a sensor, such as a hall effect sensor 156 (much like the hall effect sensor 56 shown in FIG. 7) (see FIG. 12 which shows the hall effect sensor 156 of sensor 140). The hall effect sensor 156 in the housing 142 senses the location of the at least one magnet 104 inside the magnet holder 102, and preferably electronics 160 in the housing 142 (see FIG. 12) uses the hall effect sensor 156 to effectively determine the rotational position of the louver 14 to which the magnet holder 102 is mounted.

Figure 12:
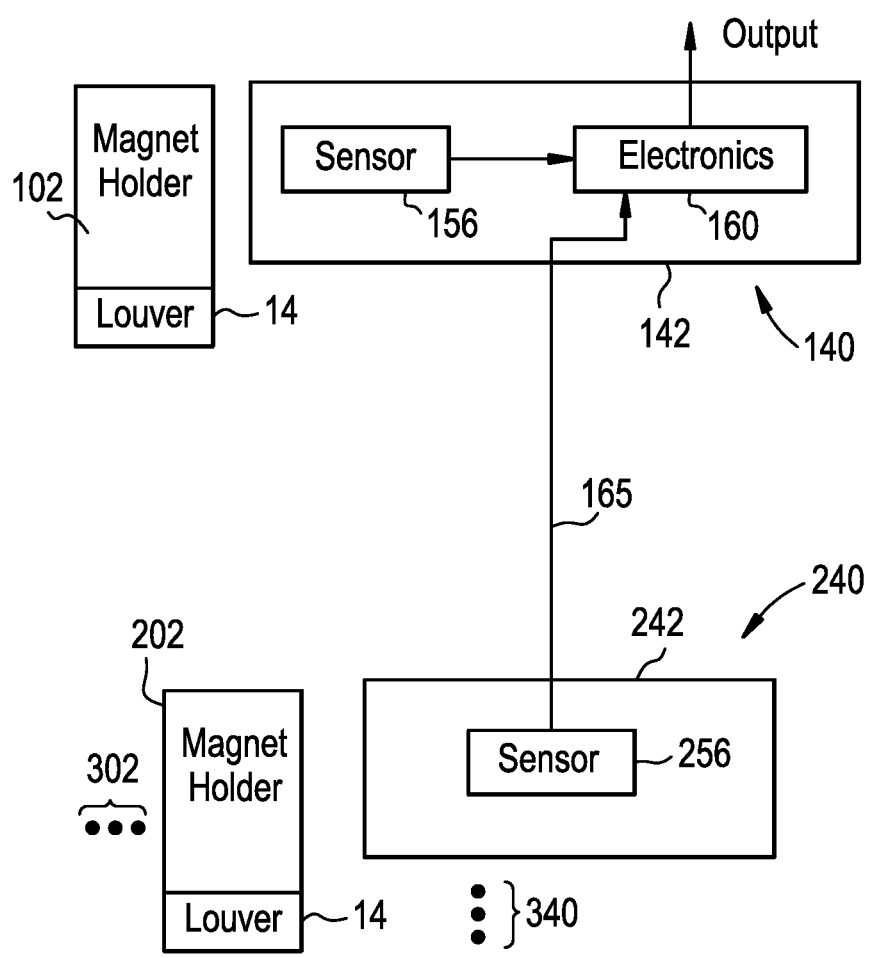
FIG. 12 is a schematic view showing the employment of two sensors and electronics configured to determine the rotational position of two louvers.

As shown in FIG. 12, a second magnet holder 202 may be mounted directly on a different louver 14a of the sieve and chaffer, and a second sensor 240, which preferably includes a housing 242 which houses another hall effect sensor 256, senses the location of at least one magnet in the second magnet holder 202. Preferably, the second sensor 240 is connected to the first sensor 140 (via cable 165), and preferably the electronics 160 is configured to calculate the rotational positions of both louvers 14, 14a to which the magnet holders 102, 202 are mounted. Preferably, the electronics 160 is configured such that it can process the position signal of the hall effect sensor 156 of the first sensor 140 and the position signal of the hall effect sensor 256 of the second sensor 240, thereby allowing the second housing 242 to omit complicated electronics in the housing 240 while still enabling the electronics 160 of the first sensor 140 to use the second hall effect sensor 256 to sense the rotational position of the louver 14a to which the magnet holder 202 is mounted. Still additional sensors can be provided (represented by the dots 340 shown in FIG. 12), as well as additional magnet holders mounted on more louvers (represented by the dots 302 shown in FIG. 12) of the sieve and chaffer, wherein the electronics 160 uses all the sensors to determine the rotational positions of the different louvers to which magnet holders are mounted.

Figure 13:
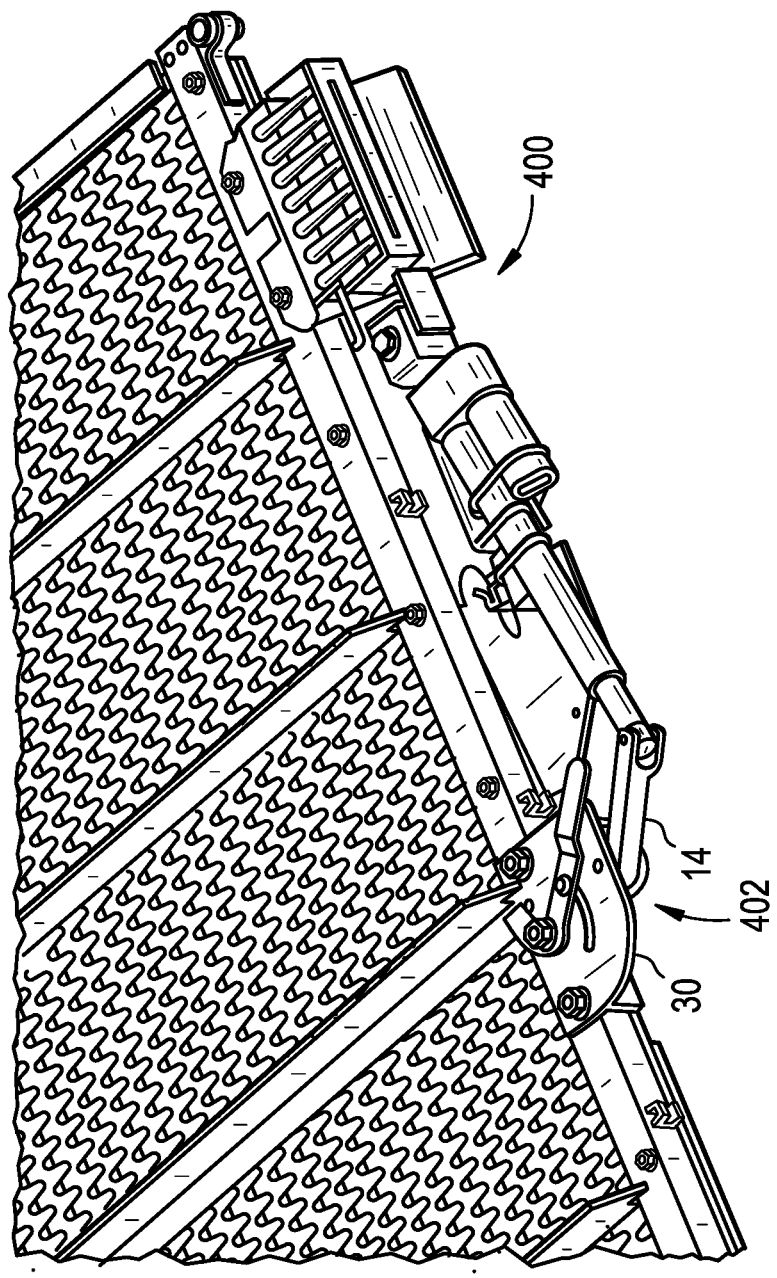
FIG. 13 shows an electromechanical actuator being used to adjust a louver adjustment mechanism, ultimately adjusting the rotational position of the louvers.

Regardless of which system is employed—i.e., either the system shown in FIGS. 4-6 wherein a sensor probe 46 is actually, physically connected to one of the louvers 14, or the system shown in FIGS. 10-12 wherein one or more magnet holders 102, 202, etc. are mounted to louvers and one or more spaced away sensors 140, 240, etc. performs the sensing of the rotational position(s) of the louver(s)—an electromechanical actuator 400 as shown in FIG. 13 could be used to adjust a louver adjustment mechanism 402, ultimately adjusting the rotational position of the louvers, preferably based on what is sensed by the sensors (in which case part number 72 in FIG. 9 would equate to part number 400 in FIG. 13).

Figure 14:
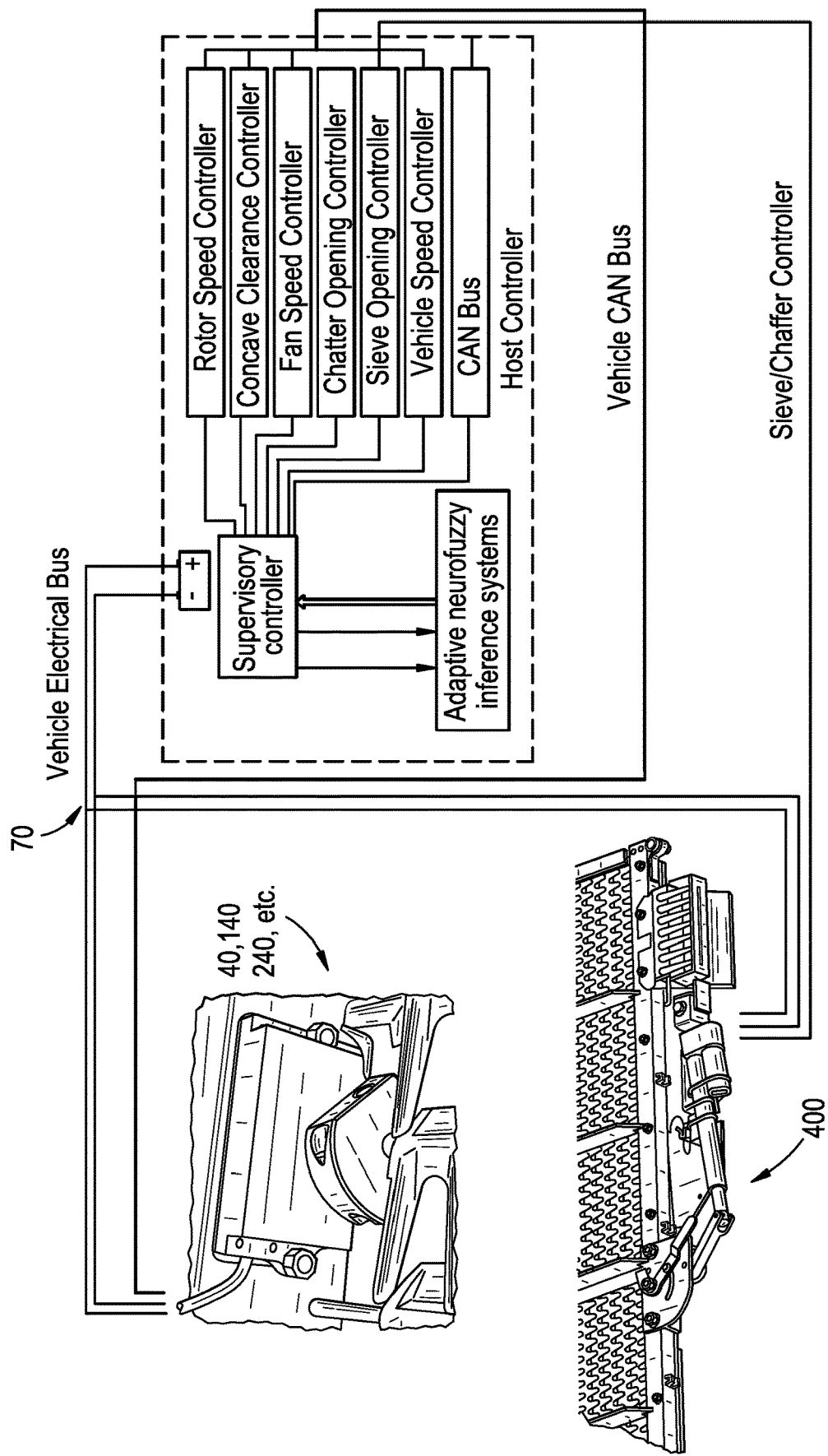
FIG. 14 illustrates one possibility of a system architecture with which either sensor system—i.e., either the system shown in FIGS. 4-6 or the system shown in FIGS. 10-12—can be used along with the electromechanical actuator shown in FIG. 13.

FIG. 14 illustrates one possibility of a system architecture with which either sensor system—i.e., either the system shown in FIGS. 4-6 wherein a sensor probe 46 is actually, physically connected to one of the louvers 14, or the system shown in FIGS. 10-12 wherein one or more magnet holders 102, 202, etc. are mounted to louvers—can be used along with the electromechanical actuator 400.

While specific embodiments of the invention have been shown and described, it is envisioned that those skilled in the art may devise various modifications without departing from the spirit and scope of the present invention.

What is claimed is:

1. A sieve and chaffer of a combine harvester, said sieve and chaffer comprising a louver position sensing system, at least one rotatable wire, and at least one louver mounted on the at least one rotatable wire, said louver position sensing system comprising at least one magnet holder which is mounted directly to said at least one louver rather than to said at least one rotatable wire such that said at least one magnet holder and said at least one louver are in direct, physical contact with each other such that the at least one magnet holder and said at least one rotatable wire are spaced away from each other, said magnet holder having at least one magnet inside the magnet holder, and a housing spaced away from, and not in physical contact with the at least one magnet holder, said housing having a sensor and electronics inside the housing, wherein the magnet holder, with the at least one magnet inside, rotates outside of the housing along with the at least one louver, said electronics in the housing configured to use the sensor in the housing to sense a rotational position of the at least one magnet in the magnet holder, while the magnet holder, with the at least one magnet inside, remains outside of the housing, and determine a position of said at least one louver based on the rotational position of the at least one magnet.

2. A sieve and chaffer as recited in claim 1, wherein the sieve and chaffer comprises at least one divider, and wherein said housing is mounted to said at least one divider.

3. A sieve and chaffer as recited in claim 1, wherein the sieve and chaffer comprises a divider, wherein the housing is mounted to the divider.

4. A sieve and chaffer as recited in claim 1, wherein the sensor comprises a hall effect sensor which is inside the housing and which is configured to sense the at least one magnet which is in the magnet holder.

5. A sieve and chaffer as recited in claim 1, wherein a cable extends from the housing and the electronics in the housing uses the cable to communicate the position of the at least one louver to a vehicle host controller.

6. A sieve and chaffer as recited in claim 1, wherein an output of the electronics in the housing is either broadcast to a CAN bus of the combine harvester or transmitted directly to a controller of the combine harvester.

7. A sieve and chaffer as recited in claim 6, further comprising at least one sieve linear actuator that is connected to the CAN bus of the combine harvester or transmitted directly to a controller of the combine harvester and at least one adjustment bar of the sieve and chaffer.

8. A sieve and chaffer of a combine harvester, said sieve and chaffer comprising a louver position sensing system, a first louver and a second louver, said louver position sensing system comprising: a first magnet holder in actual, physical contact with said first louver, said first magnet holder having a first magnet therein; a second magnet holder in actual, physical contact with said second louver, said second magnet holder having a second magnet therein; a first housing having a first sensor and electronics therein; a second housing having a second sensor therein, wherein the electronics in the first housing is configured to use the first sensor in the first housing to calculate the position of the first louver and is configured to use the second sensor in the second housing to calculate the position of the second louver.

9. A sieve and chaffer as recited in claim 8, wherein the sieve and chaffer comprises a third louver, said louver position sensing system comprising: a third housing having a third sensor therein, a third magnet holder in actual, physical contact with said third louver, said third magnet holder having a third magnet therein, wherein the electronics in the first housing is configured to use the third sensor in the third housing to calculate the position of the third louver.

10. A sieve and chaffer as recited in claim 8, wherein the sieve and chaffer comprises at least one divider, and wherein said first housing is mounted to said at least one divider.

11. A sieve and chaffer as recited in claim 8, wherein the sieve and chaffer comprises a divider, wherein the first housing is mounted to the divider.

12. A sieve and chaffer as recited in claim 8, wherein the sensor comprises a hall effect sensor which is inside the first housing and which is configured to sense the at least one magnet which is in the magnet holder.

13. A sieve and chaffer as recited in claim 8, wherein a cable extends from the first housing and the electronics in the first housing uses the cable to communicate the position of the at least one louver to a vehicle host controller.

14. A sieve and chaffer as recited in claim 8, wherein an output of the electronics in the first housing is either broadcast to a CAN bus of the combine harvester or transmitted directly to a controller of the combine harvester.

15. A sieve and chaffer as recited in claim 14, further comprising at least one sieve linear actuator that is connected to the CAN bus of the combine harvester or transmitted directly to a controller of the combine harvester and at least one adjustment bar of the sieve and chaffer.

\* \* \* \* \*